US011165313B2

(12) United States Patent
Kurata et al.

(10) Patent No.: US 11,165,313 B2
(45) Date of Patent: Nov. 2, 2021

(54) DECELERATOR-EQUIPPED MOTOR UNIT

(71) Applicants: MABUCHI MOTOR CO., LTD., Chiba (JP); CONTINENTAL AUTOMOTIVE GmbH, Hannover (DE)

(72) Inventors: Junya Kurata, Chiba (JP); Satoshi Kikuchi, Chiba (JP); Bjoern Schmitz, Steisslingen (DE); Erwin Kessler, Bad Saulgau (DE); Gebhard Hopfmueller, Schoenau-Siebenhaus (AT)

(73) Assignees: MABUCHI MOTOR CO., LTD., Chiba (JP); CONTINENTAL AUTOMOTIVE GMBH, Hannover (DE)

( * ) Notice: Subject to any disclaimer, the term of this patent is extended or adjusted under 35 U.S.C. 154(b) by 137 days.

(21) Appl. No.: 16/631,431

(22) PCT Filed: Jul. 31, 2018

(86) PCT No.: PCT/JP2018/028568
§ 371 (c)(1),
(2) Date: Jan. 15, 2020

(87) PCT Pub. No.: WO2019/026876
PCT Pub. Date: Feb. 7, 2019

(65) Prior Publication Data
US 2020/0186013 A1 Jun. 11, 2020

(30) Foreign Application Priority Data
Aug. 1, 2017 (JP) ............................... JP2017-149348

(51) Int. Cl.
*H02K 11/38* (2016.01)
*H02K 5/22* (2006.01)
*H02K 7/116* (2006.01)
(Continued)

(52) U.S. Cl.
CPC ............. *H02K 11/38* (2016.01); *H02K 5/225* (2013.01); *H02K 7/1166* (2013.01); *H05K 1/18* (2013.01); *H02K 11/21* (2016.01); *H02K 2211/03* (2013.01)

(58) Field of Classification Search
CPC .. H05K 1/18; H02K 5/00; H02K 5/14; H02K 5/148; H02K 5/15; H02K 5/22;
(Continued)

(56) References Cited

U.S. PATENT DOCUMENTS 5,184,039 A * 2/1993 Kraft ...................... H02K 5/148
310/239
6,969,933 B2 * 11/2005 Mao ...................... H02K 7/1166
310/152
(Continued)

FOREIGN PATENT DOCUMENTS

| JP | 2015177557 A | 10/2015 |
| WO | 2016010022 A1 | 1/2016 |
| WO | 2017122766 A1 | 7/2017 |

OTHER PUBLICATIONS

International Search Report and Written Opinion dated Oct. 30, 2018, for corresponding PCT Application No. PCT/JP2018/028568.
(Continued)

*Primary Examiner* — Tran N Nguyen
(74) *Attorney, Agent, or Firm* — Kinney & Lange, P.A.

(57) ABSTRACT

Provided is a decelerator-equipped motor unit which can achieve cost reductions in the control board and improvement of both mechanical and electrical reliability through a particular arrangement of elements on the board, thereby achieving a smaller size by realizing an appropriate board shape without increasing the size of the unit.

7 Claims, 12 Drawing Sheets

(51) Int. Cl.
*H05K 1/18* (2006.01)
*H02K 11/21* (2016.01)

(58) Field of Classification Search
CPC ........ H02K 5/225; H02K 11/00; H02K 11/21;
H02K 11/215; H02K 11/30; H02K 11/38;
H02K 7/00; H02K 7/11; H02K 7/116;
H02K 7/1166; H02K 15/00; H02K 15/02;
H02K 15/14; H02K 15/15
See application file for complete search history.

(56) References Cited

U.S. PATENT DOCUMENTS

| | | | | |
|---|---|---|---|---|
| 7,298,062 | B2* | 11/2007 | Kokubu | H02K 5/148 |
| | | | | 29/596 |
| 7,602,090 | B2* | 10/2009 | Huck | H02K 5/225 |
| | | | | 310/68 B |
| 2003/0137202 | A1 | 7/2003 | Mao et al. | |
| 2005/0040715 | A1 | 2/2005 | Nesic | |
| 2010/0176696 | A1 | 7/2010 | Mizutani et al. | |
| 2017/0203722 | A1 | 7/2017 | Shoda et al. | |

OTHER PUBLICATIONS

International Preliminary Report on Patentability (and Written Opinion) dated Feb. 4, 2020, for corresponding PCT Japanese Application No. PCT/JP2018/028568, 6 pages.
International Preliminary Report on Patentability dated Feb. 13, 2020, received for corresponding Japanese Application No. PCT/JP2018/028570, 18 pages.

* cited by examiner

DECELERATOR-EQUIPPED MOTOR UNIT

CROSS-REFERENCE TO RELATED APPLICATION(S)

This application is the national phase of PCT Application No. PCT/JP2018/028568 filed on Jul. 31, 2018, which in turn claims priority to Japanese Application No. 2017-149348 filed on Aug. 1, 2017, both of which are incorporated herein by reference.

BACKGROUND

Technical Field

The present disclosure relates to a decelerator-equipped motor unit, and more particularly relates to a decelerator-equipped motor unit which has a built-in control board which carries out drive control for a motor, and outputs rotation of the motor via a decelerator comprising a worm and a worm wheel.

Background Art

One conventional example of this type of decelerator-equipped motor unit is the power window unit described in US Patent Application Publication No. 2003/0137202. As shown in FIG. 1 of US Patent Application Publication No. 2003/0137202, a worm wheel is rotatably supported around an axial line inside a wheel containment chamber demarcated inside a main casing unit of the power window unit. The motor is secured to the main casing unit by a total of four screws on a side intersecting the axial line of the worm wheel at a right angle, and the worm, which is affixed to an output shaft of the motor, meshes with the worm wheel. A board containment chamber is demarcated in the main casing unit so as to neighbor the wheel containment chamber on one side, and a control board is disposed inside a board containment chamber.

The control board is electrically connected to the motor, receives input of power and operational signals from the outside via connectors which are oriented in the direction opposite the wheel containment chamber, and carries out drive control of the motor in accordance with the operation signals.

However, the power window unit described in US Patent Application Publication No. 2003/0137202 has the problem of being unable to achieve an appropriate board shape and a compact size of the unit at the same time.

Specifically, as noted above, the motor is secured to the main casing unit by four screws (henceforth, "motor securing units"), and these motor securing units are in places which overlap with the control board in the axial direction of the output shaft of the motor. Therefore, to prevent interference with the two motor securing units on the side near the control board, large escape sections are formed on both sides of the control board.

This type of irregular board shape is a factor causing a large increase in manufacturing costs of the control board, and is also a factor in causing a drop in the reliability of the power window unit, since optimal arrangement of elements on the board is made difficult by the diminishing board area.

To solve these problems, measures have been considered for avoiding the overlap between the motor securing units and the control board by moving the positions of the motor securing units in a direction away from the main casing unit. However, because moving the motor securing units in this way also causes the motor itself to move away from the main casing unit, the problem arises of the power window unit becoming larger in the axial direction of the output shaft of the motor.

As a result, with the power window unit in US Patent Application Publication No. 2003/0137202 the problem of restrictions on board size or the problem of increased unit size cannot be avoided, so a fundamental reassessment has been desired.

SUMMARY

The present disclosure provides a decelerator-equipped motor unit which can achieve cost reductions in the control board and improvement of both mechanical and electrical reliability through optimal arrangement of elements on the board by achieving a smaller size by realizing an appropriate board shape without increasing the size of the unit.

To achieve this object, a decelerator-equipped motor unit includes a worm wheel which is disposed inside a wheel containment chamber of a main casing unit and which is rotatably supported around an axial line, a motor which is secured by securing members to the main casing unit from a first side which intersects the axial line of the worm wheel at a right angle, and in which a worm which is affixed to an output shaft meshes with the worm wheel, a board containment chamber demarcated in the main casing unit so as to neighbor the wheel containment chamber on one side, and a control board which is disposed in the board containment chamber in an attitude intersecting with an axial output shaft line of the output shaft of the motor, the control board being electrically connected with the motor and being provided with a connector which is connected with the outside on one side of the control board, wherein the control board is electrically connected to the motor by a board-side terminal being provided to a motor-side site on the control board (15), and a motor-side terminal of the motor which is secured to the main casing unit towards the first side and fitted into the board-side terminal from on top of a top face of the board-side terminal. A distance between a motor-side end of the top face and the circuit board is larger than a distance between a connector-side end of the top face and the circuit board. The board-side terminal includes a bottom face opposite to the top face and further includes press-fitting ends protruding from the bottom face and being press-fitted into holes formed in the control board. Alternatively or in addition to the press-fitting ends, the bottom face is at least partially soldered onto the control board.

With the decelerator-equipped motor unit thus constituted, the top face of the board-side terminal is non-parallel to the control board. Or in other words, a connection line connecting the motor-side end of the top face and the connector-side end of the top face forms an acute angle with the control board. In such configuration, when the control board is tilted in a direction such that a motor-side end of the control board is displaced towards another side from an attitude intersecting the axial output shaft line at a right angle, this tilted configuration of the control board can be compensated by the non-parallel configuration of the top face of the board-side terminal. The board-side terminal is further securely fastened on the control board using the press-fitting ends and/or the soldering. As a result, a reliable electrical connection between the board-side terminal and the motor-side terminal can be achieved even for tilted configurations of the control board.

In an embodiment, at least one of the press-fitting ends is located as close as possible to a motor-side end of the bottom face and at least one of the press-fitting ends is located as close as possible to a connector-side end of the bottom face.

With the decelerator-equipped motor unit thus configured, it is ensured that the press-fitting ends are as close as possible to the motor-side end and the connector-side end of the bottom face of the board-side terminal, respectively. As a result, a distance between adjacent press-fitting ends is maximized. Thus, forces acting upon the board-side terminal during fitting of the motor-side terminal into the board-side terminal can be absorbed more easily allowing for a more stable and a more long-term reliable electrical connection between the motor-side terminals and the board-side terminals.

In an embodiment, the overall shape of the top face in a first direction from the motor-side end of the top face to the connector-side end of the top face is at least partially convex.

With the decelerator-equipped motor unit thus configured, upon fitting the motor-side terminal into the board-side terminal, fitting forces can be reduced because the motor-side terminal is facing a convex top face and thus an overall contact area between the motor-side terminal and the board-side terminal can be reduced.

In an embodiment, the overall shape of the top face in a first direction from the motor-side end of the top face to the connector-side end of the top face is at least partially concave.

With the decelerator-equipped motor unit thus configured, upon fitting the motor-side terminal into the board-side terminal, similarly to the convex shape, fitting forces between the motor-side terminal and the board-side terminal can be reduced because the motor-side terminal is facing a concave top face and thus an overall contact area between the motor-side terminal and the board-side terminal can be reduced.

In an embodiment, the overall shape of the top face in a second direction perpendicular to the first direction is at least partially convex.

With the decelerator-equipped motor unit thus configured, the motor-side terminal can be easily fitted with reduced fitting forces into the board-side terminal from on top of the top face.

In an embodiment, the control board is tilted in a direction such that a motor-side end of the control board is displaced towards another side from an attitude intersecting the axial output shaft line of the output shaft of the motor at a right angle, and the distance between the motor-side end of the top face and the circuit board and the distance between the connector-side end of the top face and the circuit board are selected such that a first direction of the top face from the motor-side end to the connector-side end is substantially perpendicular to the axial output shaft line of the output shaft.

With the decelerator-equipped motor unit thus configured, when the motor-side terminal is fitted into the board-side terminal along a fitting direction substantially parallel to the axial output shaft line, the top face is arranged substantially perpendicular to the fitting direction. As a result, the motor-side terminal can always be securely and long-term reliably fitted into the board-side terminal from on top of the top face of the board-side terminal.

According to another aspect of the present disclosure, a decelerator-equipped motor unit includes a worm wheel which is disposed inside a wheel containment chamber of a main casing unit and which is rotatably supported around an axial line, a motor which is secured by securing members to the main casing unit from a side which intersects the axial line of the worm wheel at a right angle, and in which a worm which is affixed to an output shaft meshes with the worm wheel, a board containment chamber demarcated in the main casing unit so as to neighbor the wheel containment chamber on one side, and a control board which is disposed in the board containment chamber in an attitude intersecting with the axial line of the output shaft of the motor, which is electrically connected with the motor, and which is provided with a connector which is connected with the outside on one side, wherein the control board is tilted in a direction such that a motor-side end is displaced towards another side from an attitude intersecting the axial line of the output shaft of the motor at a right angle, the motor-side end thereby moving away from a securing unit of the securing member in the axial line direction of the output shaft.

With the decelerator-equipped motor unit thus constituted, overlap between the securing units and the control board in the axial line direction of the output shaft of the motor can be avoided, obviating the need to form escape sections in the control board to prevent interference with the securing units. Hence, it is possible to eliminate restrictions on board shape and achieve a control board with an appropriate board shape, e.g., a common rectangular shape. Furthermore, it is possible to avoid increasing the size of the unit, since there is no need to move the position of the securing units in a direction away from the main casing unit in order to avoid overlap between the control board and the securing units, as in the technology in US Patent Application Publication No. 2003/0137202, for example.

In another aspect of the present disclosure the board containment chamber has an opening formed opposite the motor, it is preferable that a connector cover constituting the connector be removably disposed so as to block the opening, and the control board be inserted along a board surface, from the side opposite the motor, and through the opening.

With the decelerator-equipped motor unit thus configured, the opening in the board containment chamber is only required to be big enough to prevent interference between the control board inserted along the board surface and elements mounted thereon, and therefore functionality is maintained without problems even with a small opening. As a result, the main casing unit has better strength than if a large opening is formed.

As another aspect of the present disclosure, it is preferable that the space between the opening in the board containment chamber and the connector cover be filled with watertight packing.

With the decelerator-equipped motor unit thus constituted, the length of the seal required for watertight sealing is reduced, making it possible to make the watertight packing smaller and to reduce the difficulty of achieving watertight sealing.

As another aspect of the present disclosure, it is preferable that the opening in the board containment chamber be formed opposite the motor and diagonally to said direction, the connector cover and a connector terminal constituting the connector be provided to the control board protruding in the first side through the opening, and the connector cover be provided to the opening in the board containment chamber from the first side so as to envelop the connector terminal and block the opening.

With the decelerator-equipped motor unit thus constituted, the insertion position of the control board and the protruded disposal of the connector terminal are both achieved with the simple shape of merely forming the opening in the board containment chamber in a diagonal direction, simplifying the configuration near the opening.

As another aspect of the present disclosure, it is preferable that the control board be electrically connected to the motor by a board-side terminal being provided to a motor-side site on the control board, and the motor-side terminal of the motor which is secured to the main casing unit towards the first side be fitted into the board-side terminal, and the motor-side end of the control board and the board-side terminal be displaced towards the second side by tilting of the control board.

With the decelerator-equipped motor unit thus constituted, the motor-side end of the control board which has been tilted and the board-side terminal are displaced towards the second side, and therefore the position of the motor also moves toward the second side, resulting in a smaller unit.

As another aspect of the present disclosure, it is preferable that the control board be electrically connected to the motor by a board-side terminal being provided to a motor-side site on the control board, and the motor-side terminal of the motor which is secured to the main casing unit towards the first side being fitted into the board-side terminal, and a terminal guide unit which corrects the position of the board-side terminal on the control board inserted from the opposite side of the motor via the opening be provided inside the board containment chamber.

With the decelerator-equipped motor unit thus constituted, the motor-side terminal can be fitted without fail, since the position is corrected by the terminal guide unit, despite the ease with which misalignment occurs in the small and low-rigidity board-side terminal due to tilting, etc.

As another aspect of the present disclosure, it is preferable that the control board be electrically connected to the motor by a board-side terminal being provided to a motor-side site on the control board, and the motor-side terminal of the motor which is secured to the main casing unit towards the first side being fitted into the board-side terminal, and a board position limiting unit which limits the position of the control board by abutting the control board towards the second side near the board-side terminal when fitting the motor-side terminal into the board-side terminal be provided inside the board containment chamber.

With the decelerator-equipped motor unit thus constituted, the board-side terminal receives a pressing force from the motor-side terminal during fitting, but does not move or deform due to the position being limited by the terminal position limiting unit via the control board, and therefore the motor-side terminal can be fitted without fail.

As another aspect of the present disclosure, it is preferable that the control board be electrically connected to the motor by a board-side terminal being provided to a motor-side site on the control board, and the motor-side terminal of the motor which is secured to the main casing unit towards the first side being fitted into the board-side terminal, and a terminal position limiting unit which limits the position of the board-side terminal by abutting the board-side terminal towards the second side when fitting the motor-side terminal into the board-side terminal be provided inside the board containment chamber.

With the decelerator-equipped motor unit thus constituted, the board-side terminal receives a pressing force from the motor-side terminal during fitting, but does not move or deform due to warping or deformation of the control board being prevented by the position limitation of the terminal position limiting unit, and therefore the motor-side terminal can be fitted without fail.

As another aspect of the present disclosure, it is preferable that tilting the control board cause a site opposite the motor on the board containment chamber to move away from the wheel containment chamber towards the first side, and an engagement unit which allows attachment and removal of one side of the connector be provided to a space created by said moving away With the decelerator-equipped motor unit thus constituted, the site on the board containment chamber opposite the motor moves towards the first side away from the wheel containment chamber, and because the space thus created is used to form the engagement unit, one side of the connector can be affixed by a simple engagement principle, with no need for a complex securing structure.

As another aspect of the present disclosure, it is preferable that the wheel containment chamber be demarcated by one side surface along the axial line of the worm wheel being blocked by a cover member, and tilting the control board causes a site opposite the motor on the board containment chamber to move away from the wheel containment chamber towards the first side, and the surrounding edges of the cover member are joined to the surrounding edges of the wheel containment chamber by caulking in the space created by said moving away.

With the decelerator-equipped motor unit thus constituted, the site on the board containment chamber opposite the motor moves towards the first side away from the wheel containment chamber, and because the space thus created is used for the caulking, the cover member can be joined to the wheel containment space with simple caulking, with no need for a complex joining structure.

With the decelerator-equipped motor unit according to the present disclosure, cost reductions in the control board and improvement of mechanical and electrical reliability through optimal arrangement of elements on the board can be achieved by achieving a smaller size by realizing an appropriate board shape without increasing the size of the unit.

DETAILED DESCRIPTION

An embodiment is described below in which the present disclosure is applied to a power window unit which is installed inside a vehicle door and raises and lowers a window.

Figure 1:
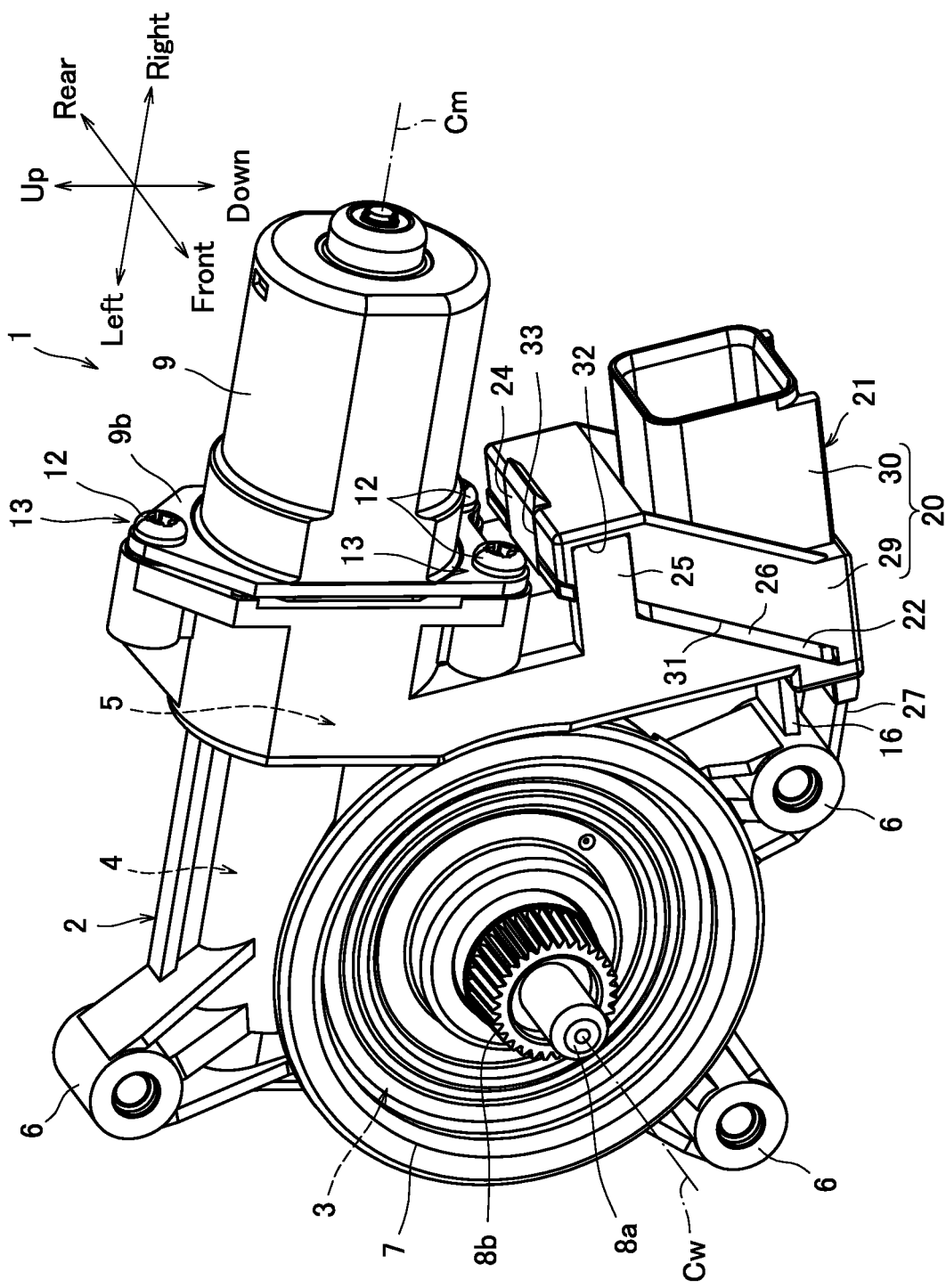
FIG. 1 is an oblique view showing a power window unit according to an embodiment.
Figure 2:
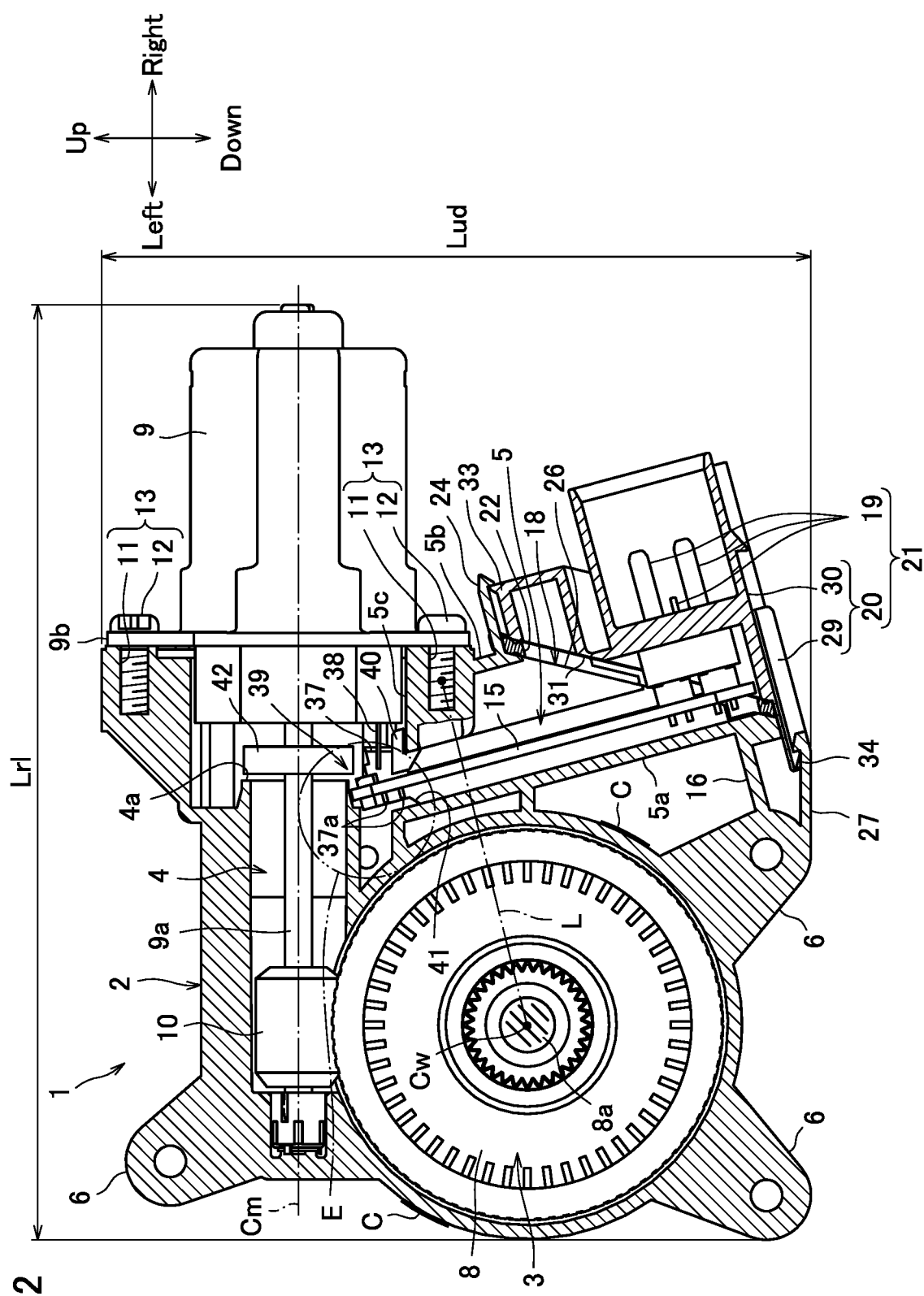
FIG. 2 is a cross-sectional view showing the power window unit.
Figure 3:
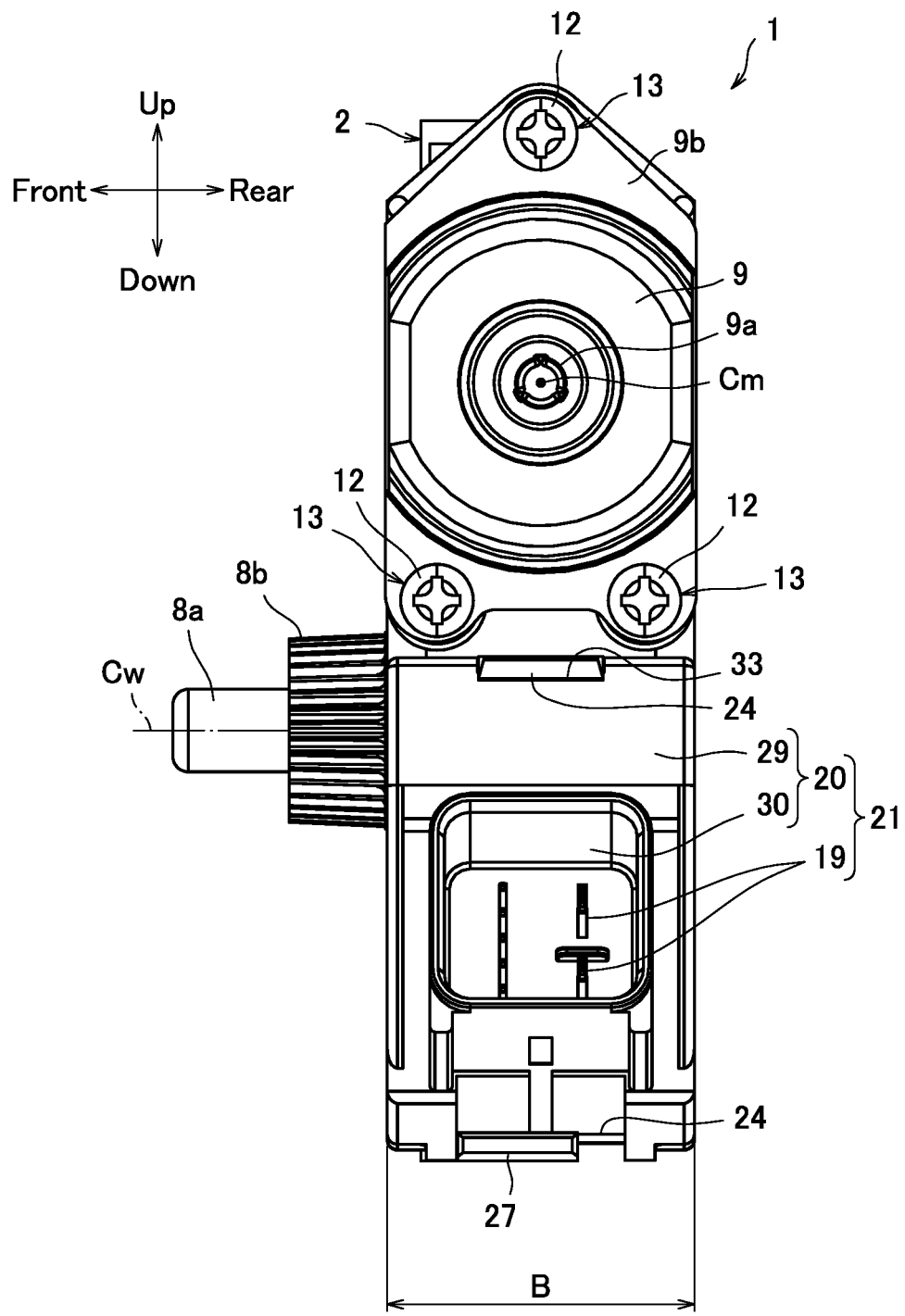
FIG. 3 is a right-side lateral view showing the power window unit of FIG. 1.

FIG. 1 is an oblique view showing a power window unit according to the present embodiment. FIG. 2 is a cross-sectional view showing the power window unit. FIG. 3 is a right-side lateral view showing the power window unit of FIG. 1. The vertical and horizontal directions are defined below in accordance with FIG. 2, the direction intersecting the paper at a right angle being the depth direction.

To describe the relationship of correspondences relating to expressions of direction in the present embodiment and the present disclosure ahead of the description proper, the right side in the present embodiment corresponds to a first side in the present disclosure, and the left side in the present embodiment corresponds to a second side. Furthermore, the upper side, upwards, the top edge, and the top in the present embodiment correspond to the motor side in the present disclosure, and the lower side, downwards, the bottom edge, and the bottom correspond to the side opposite the motor in the present disclosure.

A main casing unit 2 in the power window unit 1 is made out of plastic, and a wheel containment chamber 3, a worm containment chamber 4, and a board containment chamber 5 described below are formed integrally therewith. The wheel containment chamber 3 forms a circular shape when seen from the front, and two attachment brackets 6 on the left and the right on the bottom and one on the top of the wheel containment chamber 3 are formed integrally therewith. The wheel containment chamber 3 has a predetermined thickness in the depth direction, the front surface (corresponding to the one side surface in the present disclosure) being formed open. A front cover 7 (corresponding to the cover member in the present disclosure) formed by press-molding an aluminum plate is disposed in the opening.

Two locations, which oppose one another at 180 degrees, on the surrounding edge of the front cover 7 (indicated by the letter C in FIG. 2) are joined to the surrounding edge of the wheel containment chamber 3 by caulking, the opening thereby being blocked and the wheel containment chamber 3 being demarcated. A worm wheel 8 is rotatably supported around an axial line Cw which extends in the depth direction inside the wheel containment chamber 3, and an output shaft 8a of the worm wheel 8 passes through the front cover 7 and protrudes in the depth direction.

The worm containment chamber 4 is formed from the right side in a location in the main casing unit 2 above the wheel containment chamber 3, and the interior thereof communicates with the top of the wheel containment chamber 3 located below. An output shaft 9a of a brush motor 9 (henceforth simply "motor") is inserted from the right side intersecting the axial line Cw of the worm wheel 8 inside the worm containment chamber 4, and a worm 10 which is affixed to the output shaft 9a meshes with the worm wheel 8.

Female screw sections 11 are formed on the right side surface of the main casing unit 2, one above and two below the worm containment chamber 4. Screws 12 (the securing members) pass through a flange section 9b of the motor 9 and screw into the female screw sections 11, the motor 9 thus being secured to the main casing unit 2. The three securing locations made up of the screws 12 and the female screw sections 11 are henceforth referred to as motor securing units 13 (corresponding to the securing units in the present disclosure).

The power window unit 1 is attached to a predetermined position inside the vehicle door via the three attachment brackets 6, and a serration 8b formed in the output shaft 8a of the worm wheel 8 links with the window raising/lowering mechanism. When the output shaft 9a of the motor 9 turns in a predetermined direction, that turning is decelerated by the worm 10 and the worm wheel 8 and transmitted to the window raising/lowering mechanism from the output shaft 8a, and the window is either raised or lowered, depending on the direction of turning.

The board containment chamber 5 is demarcated in the main casing unit 2 so as to neighbor the wheel containment chamber 3 to the right. Overall, the board containment chamber 5 is shaped extending vertically, and a control board 15 is installed therein such that the left side surface faces the wheel containment chamber 3 side, or in other words so as to intersect an axial output shaft line (short: axial line) Cm of the output shaft 9a of the motor 9. A detailed description will be given below, but the top of the control board 15 is electrically connected to the motor 9, and power and operational signals are input from the outside via a connector 21 provided to the bottom of the control board 15.

Note that by disposing the control board 15 inside the main casing unit 2 in this way, the control board 15 can be made common to the power window units 1 on the left and right doors, and the main casing unit 2 can be designed having the same left-right symmetry.

The control board 15 carries out the function of performing drive control of the motor 9, e.g., driving the motor 9 on the basis of the operational signals input corresponding to raising and lowering operations of the window, determining the vertical position of the window on the basis of a motor rotational angle detected by a rotational angle sensor 42 described below, and automatically stops the motor 9 at the fully closed and fully open positions. The disposal of the control board 15 inside the board containment chamber 5, the electrical connection structure with the motor 9, and the connector structure are features of the present disclosure, and are described in detail below.

Incidentally, as is clear from the above description, the layout of the worm wheel 8, the motor 9 and the control board 15 in the power window unit 1 of the present embodiment is essentially the same as that described in US Patent Application Publication No. 2003/0137202. Therefore, if the locations of the motor securing units 13 are set so as to overlap with the control board 15 in the axial line Cm direction of the output shaft 9a of the motor 9, escape sections will have to be formed in the control board 15 so as to prevent interference with the bottom two motor securing units 13 in particular. Furthermore, if the motor securing units 13 are moved to the right side away from the main casing unit 2 to avoid overlapping, the power window unit 1 will become larger in the axial line Cm direction (left and right) of the output shaft 9a.

In light of this drawback, the inventor noticed that an area E shown in FIG. 2 formed between the wheel containment chamber 3, the worm containment chamber 4 and the board containment chamber 5 is dead space, not used in any way. In other words, if, instead of moving the motor securing units 13 to the right side as in the measures described above, the top of the control board 15 (corresponding to the motor-side end in the present disclosure) is moved to the left side and disposed inside the dead space, overlapping in both directions can be avoided by moving the top of the control board 15 away from the motor securing units 13 in the axial line Cm direction of the output shaft 9a of the motor 9. As a result, an increase in size of the unit 1 due to movement of the motor securing units 13 can be prevented, and an optimum board shape with no escape sections can be maintained by avoiding the overlap.

On the other hand, it is desirable to move the bottom end of the control board 15 to the right side away from the wheel containment chamber 3 and create space there between. Details are given below, but this space is created so as to caulk the front cover 7 to the wheel containment chamber 3 and secure a connector cover 20 to an opening 18 in the board containment chamber 5, described below.

As a result, in the present embodiment, using the attitude (the upright attitude) of the control board 15 when intersecting the axial line Cm of the output shaft 9a of the motor 9 at a right angle as a reference, the control board 15 is tilted so as to move the top end to the left side and the bottom end to the right side. More precisely, the control board 15 is tilted so as to intersect at a right angle a virtual line L connecting the axial line Cw of the worm wheel 8 and the bottom motor securing unit 13. In addition, the direction of tilting is the same as in the control board in US Patent Application Publication No. 2003/0137202, but there is a fundamental difference in the fact that the overlap is avoided by moving the top end of the control board 15 away from the motor securing units 13 in the axial line Cm direction of the output shaft 9a of the motor 9, and a remarkable effect is attained on the basis of this difference. The control board 15 and the configuration therearound is described in detail below.

In order to tilt the control board 15 in the manner described above, the board containment chamber 5 itself, in which the control board 15 is disposed, is demarcated in a shape so as to tilt in the corresponding direction. In other words, a left wall 5a of the board containment chamber 5 extends along the entire vertical length of the board containment chamber 5, and the top of the left wall 5a is connected substantially directly near the wheel containment chamber 3, thereby being located in the dead space.

The bottom of the left wall 5a is connected to the bottom right attachment bracket 6 of the wheel containment chamber 3 via a plate-shaped linking bar 16. Therefore, the bottom of the left wall 5a (corresponding to the site opposite the motor in the present disclosure) is separated to the right away from the wheel containment chamber 3 by a distance corresponding to the length of the linking bar 16, as a result of which a space is created between the bottom of the board containment chamber 5 and the bottom of the wheel containment chamber 3.

To facilitate comprehension in the following description, the description will proceed in stages, focusing on the control board 15. To start, the configuration and operational effects of the bottom area of the control board 15 are described, followed by a description of the configuration and operational effects of the top area of the control board 15, which is followed lastly by a description of the operational effects of the attitude of the control board 15.

(Configuration of the Bottom Area of the Control Board 15)

Figure 4:
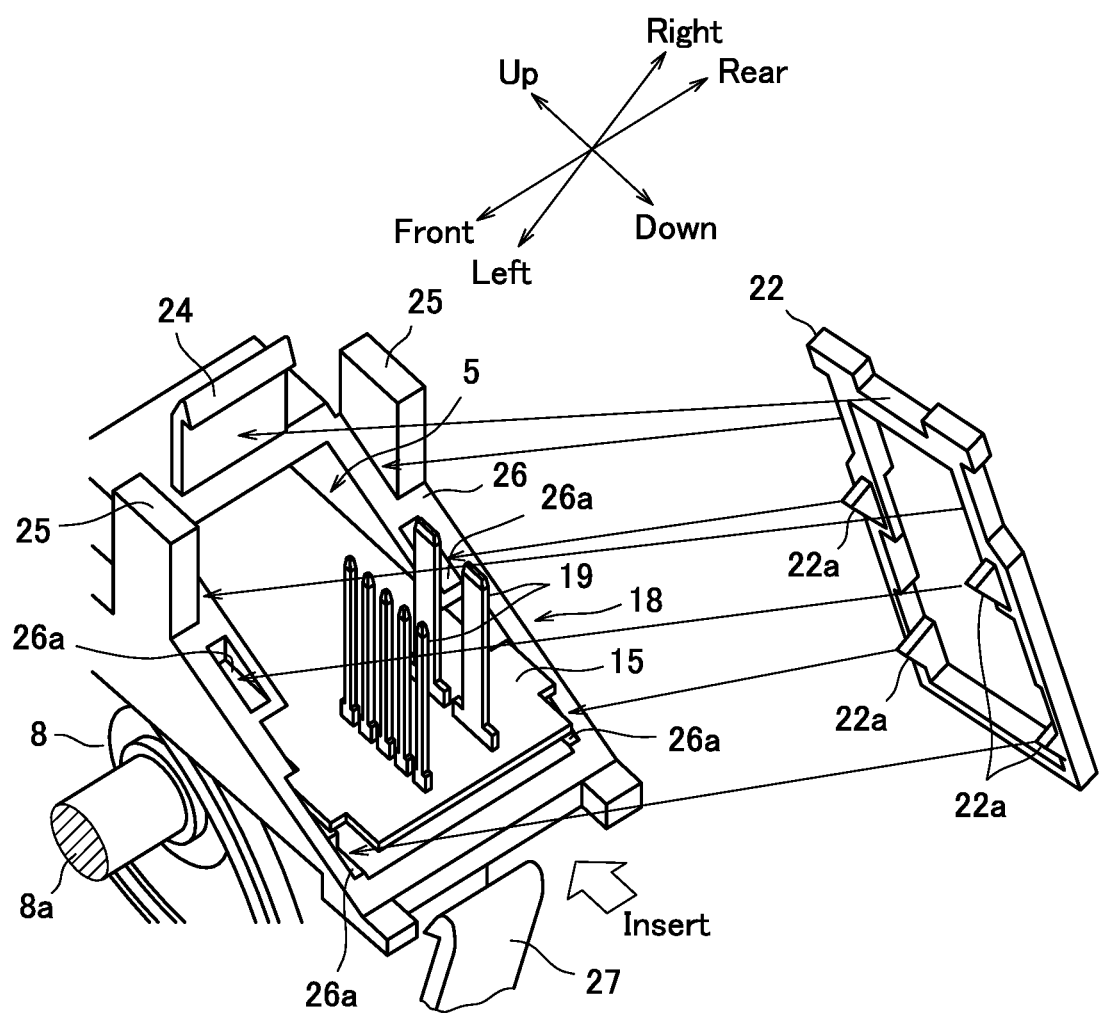
FIG. 4 is an oblique view showing an opening in a board containment chamber prior to installation of watertight packing.
Figure 5:
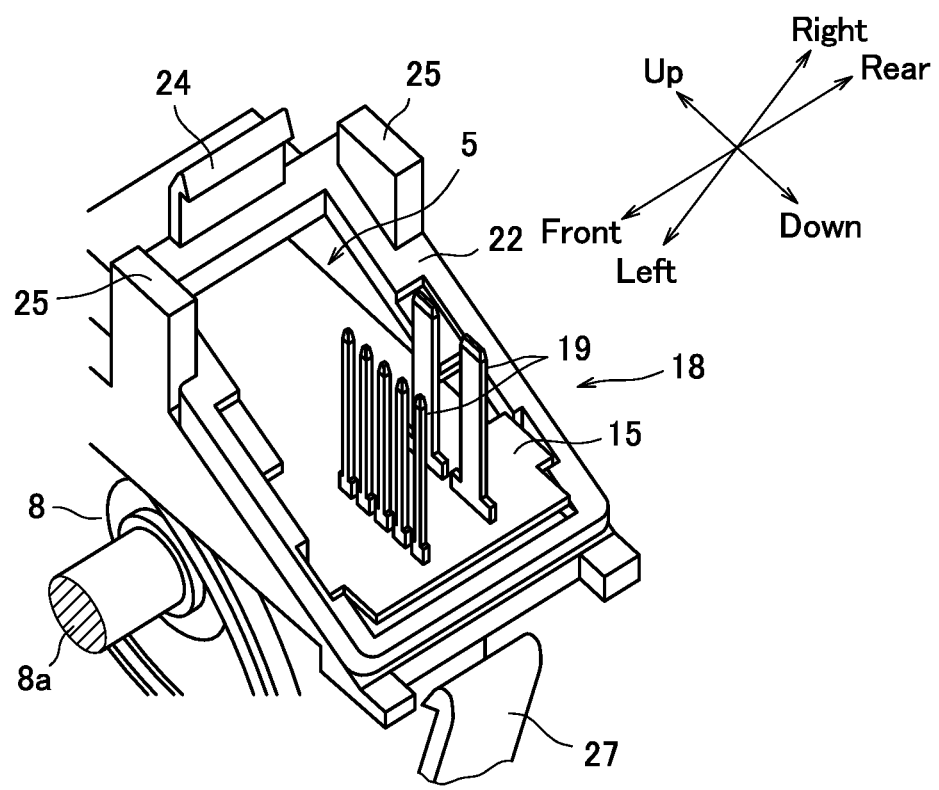
FIG. 5 is an oblique view showing an opening in a board containment chamber after installation of watertight packing.
Figure 6:
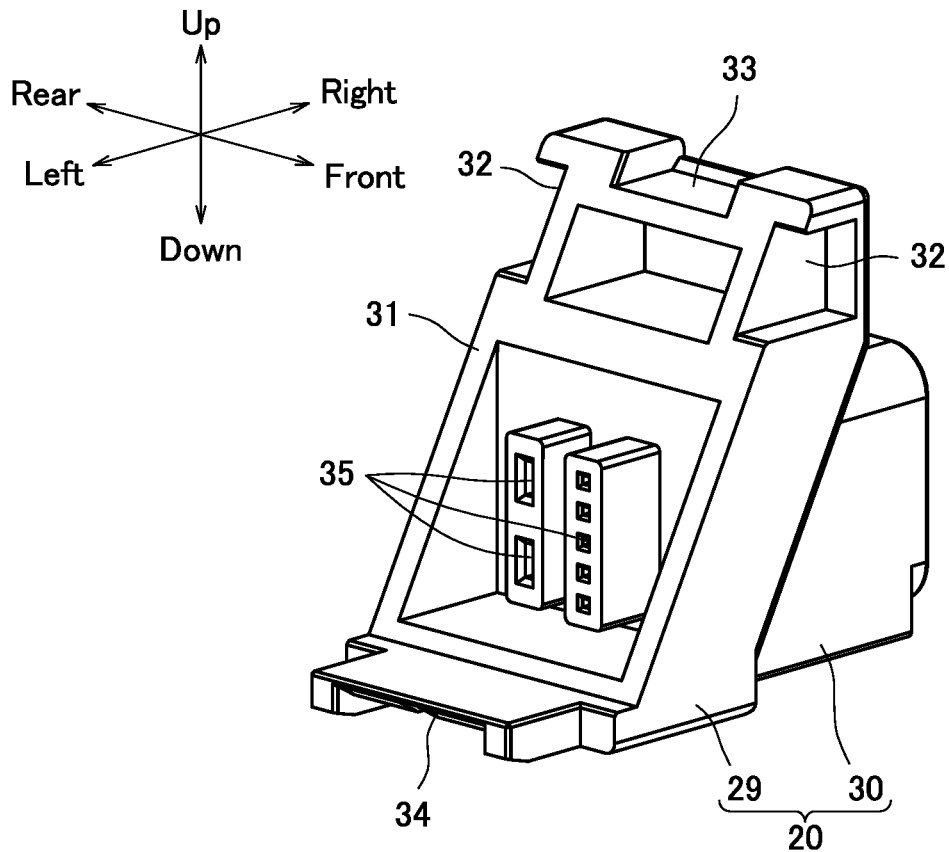
FIG. 6 is an oblique view showing a connector cover.

FIG. 4 is an oblique view showing an opening in the board containment chamber 5 prior to installation of watertight packing. FIG. 5 is an oblique view showing the opening in the board containment chamber 5 after installation of watertight packing. FIG. 6 is an oblique view showing a connector cover.

As shown in FIGS. 2, 4, and 5, in contrast to the left wall 5a which extends along the entire vertical length of the board containment chamber 5, a right wall 5b is moved to the right to create a space for disposing the control board 15, and is formed mainly in the top half of the board containment chamber 5. An opening 18 into which the control board 15 is inserted is formed at the bottom of the board containment chamber 5, and because the bottom edge of the right wall 5b is positioned higher than the bottom edge of the left wall 5a, the opening 18 opens diagonally facing down and to the right, and the open end substantially forming a rectangle.

Because the opening 18 is oriented diagonally, the control board 15 can be disposed therein by being inserted into the board containment chamber 5 along the board surface from below, as shown in FIG. 4. Note that during insertion the control board 15 is guided, with play, by grooves 5d (shown in FIG. 11) formed on both front and rear sides inside the board containment chamber 5.

A plurality of connector terminals 19 are provided the bottom of the control board 15 inserted into the board containment chamber 5 protruding and facing to the right. These connector terminals 19 are divided into power terminals and operational signal terminals. The connector terminals 19 protrude to the right side through the opening 18 which is facing diagonally. As described below, a connector 21, into which power and operational signals are input, is constituted by these connector terminals 19 and the connector cover 20 described below.

The connector cover 20 shown in FIG. 6 not only constitutes the connector 21 together with the connector terminals 19, it also performs the role of being removably secured to and blocking the opening 18 in the board containment chamber 5. The power window unit 1 is required to be watertight, so a watertight packing 22 for maintaining watertightness is interposed between the opening 18 of the board containment chamber 5 and the connector cover 20. The watertight packing 22 is positioned and affixed on the opening 18 side of the board containment chamber 5, and therefore mounting of the watertight packing 22 into the opening 18 is described ahead of the description of the connector cover 20.

An upper engaging claw 24 is provided in a protruding manner to the top of the opening 18 in the board containment chamber 5, and a pair of limiting tabs 25 are provided to both front and rear sides of the top of the opening 18 protruding in a direction parallel to the connector terminals 19. The opening 18 of the board containment chamber 5 is shaped so as to avoid the front and rear limiting tabs 25, and a flat sealing surface 26 forms a continuous strip with the entire surrounding area thereof. Positioning recesses 26a are formed in four places in the sealing surface 26.

The watertight packing 22 has a substantially rectangular shape corresponding to the sealing surface 26 of the opening 18, and positioning protrusions 22a corresponding to the positioning recesses 26a are formed in the opening 18-side surface of the watertight packing 22. The watertight packing 22 is disposed on the sealing surface 26 of the opening 18 and the positioning protrusions 22a of the watertight packing 22 are fitted into the positioning recesses 26a on the sealing surface 26, thereby preventing misalignment of the watertight packing 22 from the correct position on the sealing surface 26. The limiting tabs 25 and the upper engaging claw 24 also play the role of preventing misalignment of the watertight packing 22 to the outside at this time.

The reason the watertight packing 22 is prevented from becoming misaligned by fitting the positioning recesses 26a and the positioning protrusions 22a together in the sealing surface 26 is as follows.

Sufficient board area has to be set aside for optimal arrangement of elements on the control board 15. On the other hand, the board containment chamber 5 in which the control board 15 is disposed has to be as small as possible in order to make the power window unit 1 small. Therefore, the opening 18 is designed to have the minimum size sufficient for inserting the control board 15.

Positioning of the watertight packing 22 is typically done by forming misalignment-preventing walls for the watertight packing 22 inside or outside the sealing surface 26, but this results in the opening 18—by turn the board containment chamber 5—increasing in size by an amount equal to the thickness of the walls. To avoid this type of situation, the positioning recesses 26a and the positioning protrusions 22a are fitted together in the sealing surface 26. The board containment chamber 5 can thus be reduced in size to the minimum size, providing the effect of allowing reduction of the depth-direction thickness of the power window unit 1 (shown by B in FIG. 3) in particular.

On the other hand, as shown in FIGS. 2 and 5, a lower engaging claw 27 (engagement unit) protrudes from the attachment bracket 6 on the bottom right of the wheel containment chamber 3 to the right side so as to be below the linking bar 16, and the tip thereof is positioned below the opening 18 of the board containment chamber 5. As will be described below, the upper engaging claw 24 and the lower engaging claw 27 work together to play the role of securing the connector cover 20 to the opening 18 of the board containment chamber 5.

As shown in FIGS. 2 and 6, in the connector cover 20, a cover section 29 which blocks the opening 18 in the board containment chamber 5 and a connector section 30 which encompasses and supports the connector terminals 19 of the control board 15 are formed as a single unit.

The cover section 29 has a substantially rectangular shape corresponding to the opening 18 of the board containment chamber 5, and a flat sealing surface 31 like the opening 18 is formed therearound. Limiting recesses 32 are formed on front and rear sides thereof into which the limiting tabs 25 of the opening 18 are fitted. An upper engaging section 33 which the upper engaging claw 24 described above engages is formed in the top section of the cover section 29, while a lower engaging section 34 which the lower engaging claw 27 engages is formed in the bottom section of the cover section 29.

On the other hand, the connector section 30 is shaped protruding as a rectangle from the cover section 29 and causes the connector section 30 to be oriented to the right side when the connector cover 20 is affixed to the opening 18 of the board containment chamber 5 by forming an angle relative to the cover section 29 when seen from the front. Terminal holes 35 into which the connector terminals 19 of the control board 15 are inserted are formed in a base end (cover section 29-side) of the connector section 30, the inside of the cover section 29 and the inside of the connector section 30 being connected via these terminal holes 35.

To affix the connector cover 20 to the opening 18 of the board containment chamber 5, when the connector cover 20 is brought close to the opening 18 of the board containment chamber 5 from the right side in the correct attitude, first the limiting tabs 25 located front and rear of the opening 18 are inserted into the limiting recesses 32 in the connector cover 20. The connector 21 is therefore brought closer to the opening 18 while being limited in position front and rear and vertically. The sealing surface 31 is disposed accurately in the correct position corresponding to the sealing surface 26 of the opening 18.

Concurrently with this, the connector terminals 19 of the control board 15 are inserted into and supported by the terminal holes 35 of the connector cover 20, ends thereof protruding into and being encompassed by the connector section 30. When this happens, the connector 21 is limited in position by engagement of the limiting tabs 25 and the limiting recesses 32, and the connector terminals 19 are inserted without fail into the terminal holes 35. The support from the connector cover 20 side via the connector terminals 19 limits movement of the bottom of the control board 15 inside the board containment chamber 5.

Thereafter, the upper and lower engaging claws 24 and 27 on the opening 18 side engage the upper and lower engaging sections 33 and 34 of the connector cover 20, preventing the connector cover 20 from moving to the right side away from the opening 18. Because the limiting tabs 25 and the limiting recesses 32 are still engaged, the connector cover 20 is limited in its movement front and rear and vertically, thus being secured without fail in the correct position in the opening 18. As a result, the opening 18 of the board containment chamber 5 is blocked by the cover section 29 of the connector cover 20, and the watertight packing 22 is interposed between the sealing surface 31 of the cover section 29 and the sealing surface 26 of the opening 18, so watertightness is maintained.

(Operational Effects of the Configuration of the Bottom Area of the Control Board 15)

The operational effects provided by the configuration around the bottom area of the control board 15 thus constituted are described next.

First, the opening 18 is formed at the bottom of the board containment chamber 5, and the control board 15 is inserted into the board containment chamber 5 along the board surface. For example, in the technology in US Patent Application Publication No. 2003/0137202, the control board is inserted into the board containment chamber from a direction intersecting the board surface at a right angle, and therefore there is a need for the board containment chamber to be open to a size at least as big as the control board. Forming a large opening is disadvantageous for the main casing unit in terms of strength and makes the length of the seal requiring watertightness longer, which makes cost increases associated with making the waterproof packing 22 larger and a drop in reliability due to the increase in difficulty in achieving watertightness inevitable.

In contrast, as shown in FIGS. 4 to 6, the opening 18 according to the present embodiment only needs to be big enough to avoid interference with the control board 15 inserted along the board surface and elements mounted thereon, so even a very small opening 18 will work without a problem. This is advantageous for the main casing unit 2 in terms of strength, and allows a thin and lightweight design while maintaining the same strength as the main casing unit in the technology of US Patent Application Publication No.

2003/0137202. Cost cuts thanks to the smaller waterproof packing 22 and increased reliability due to the reduced difficulty of achieving watertightness can also be attained since the length of the seal needed for watertightness is significantly reduced.

The opening 18 in the board containment chamber 5 according to the present embodiment opens in a diagonal direction so as to be oriented not only downward but also towards the right. Therefore, the connector 21 can be constituted by causing the connector terminals 19 on the control board 15 to protrude to the right side through the opening 18 and join with the connector cover 20. Specifically, with a simple shape in which the opening 18 of the board containment chamber 5 opens diagonally down and to the right, insertion of the control board 15 from the bottom and protrusion of the connector terminals 19 to the right can both be achieved. Accordingly, the configuration around the opening 18 can be simplified, making it possible to achieve further cost reductions.

To tilt the control board 15, the bottom of the board containment chamber 5 is moved to the right side via the linking bar 16 away from the attachment bracket 6 of the wheel containment chamber 3. As a result, a space is created between the bottom of the board containment chamber 5 and the bottom of the wheel containment chamber 3, and this space is used to caulk the front cover 7 to the wheel containment chamber 3 and to form the lower engaging claw 27 which secures the connector cover 20.

First, the caulking of the front cover 7 is described. To join the front cover 7 to the wheel containment chamber 3, two places at least 180° apart therearound must be caulked, and places where the worm containment chamber 4 and the attachment bracket 6 are have to be avoided. Therefore, as shown in FIG. 2, one caulking position C is limited to between the wheel containment chamber 3 and the board containment chamber 5. If the bottom of the board containment chamber 5 is near the bottom of the wheel containment chamber 3, there is no extra space for caulking, being blocked by the board containment chamber 5, and therefore another more complicated joining structure has to be used.

In the present embodiment, the space created by the linking bar 16 is used, and caulking at the positions C can be done without problems. The front cover 7 can be joined to the wheel containment chamber 3 by simple caulking, without using a complicated joining structure, which also significantly contributes to cost reduction.

Next, formation of the lower engaging claw 27 is described. Like with the caulking, if the bottom of the board containment chamber 5 is close to the bottom of the wheel containment chamber 3, there is no extra space to form the lower engaging claw 27, being blocked by the board containment chamber 5. Therefore, the bottom of the connector cover 20 has to be secured by a complicated structure other than an engaging claw.

In the present embodiment, the space created by the linking bar 16 is used, and the lower engaging claw 27 can be formed without problems. Hence, the bottom of the connector cover 20 can be secured with a simple engaging principle without using a complicated securing structure, which also significantly contributes to cost reduction.

(Configuration of the Top Area of the Control Board 15)

The configuration around the top of the control board 15 is described next.

Figure 7:
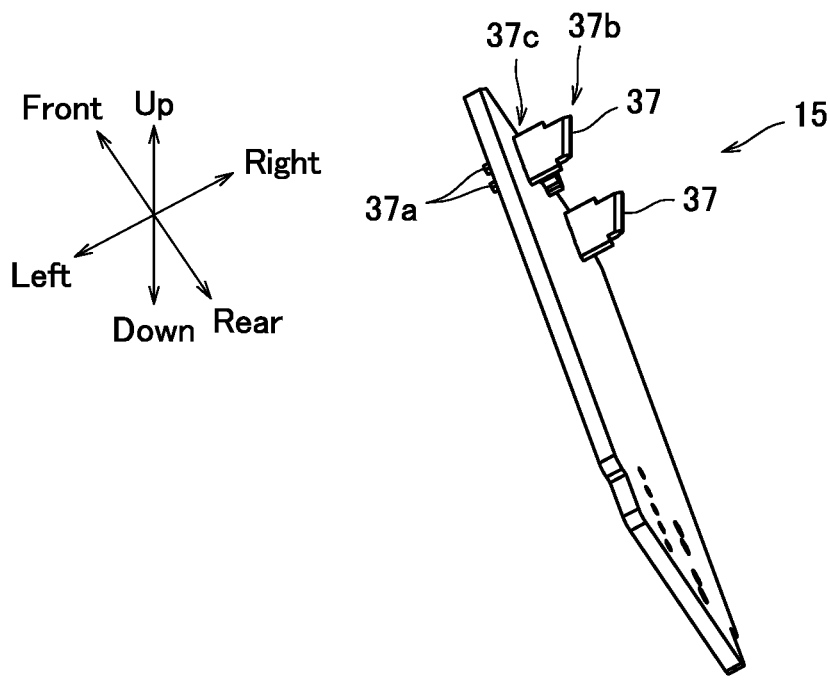
FIG. 7 is an oblique view showing a control board.

FIG. 7 is an oblique view showing the control board 15. In this drawing, the control board 15 is represented in the attitude corresponding to FIG. 2, and the elements on the board and the connector terminals 19 are omitted.

First, the configuration of the control board 15 is described on the basis of FIG. 7. Overall, the control board 15 is formed as an elongated rectangle, and no escape sections such as those in the control board described in US Patent Application Publication No. 2003/0137202 are formed. Detailed reasoning is given below, but it is because there is no need to prevent interference with the bottom two motor securing units 13.

A pair of board-side terminals 37 (a positive and a negative pole) for an electrical connection with the motor 9 are disposed on the upper section of the control board 15. The board-side terminals 37 protrude to the right side in positions a predetermined distance apart in the depth direction. The board-side terminals 37 have a flat shape in the depth direction. The board-side terminals 37 have a top face 37b and a bottom face 37c opposite to the top face 37b. A pair of upper and lower press-fitting ends 37a are provided integrally and in a protruding manner to the left of each. The pair of upper and lower press-fitting ends 37a protrude from the bottom face 37c. When the press-fitting ends 37a are press-fitted into holes formed in the control board 15, the board-side terminals 37 are secured to the control board 15, and the press-fitting ends 37a protrude to the left from the control board 15.

Figure 8:
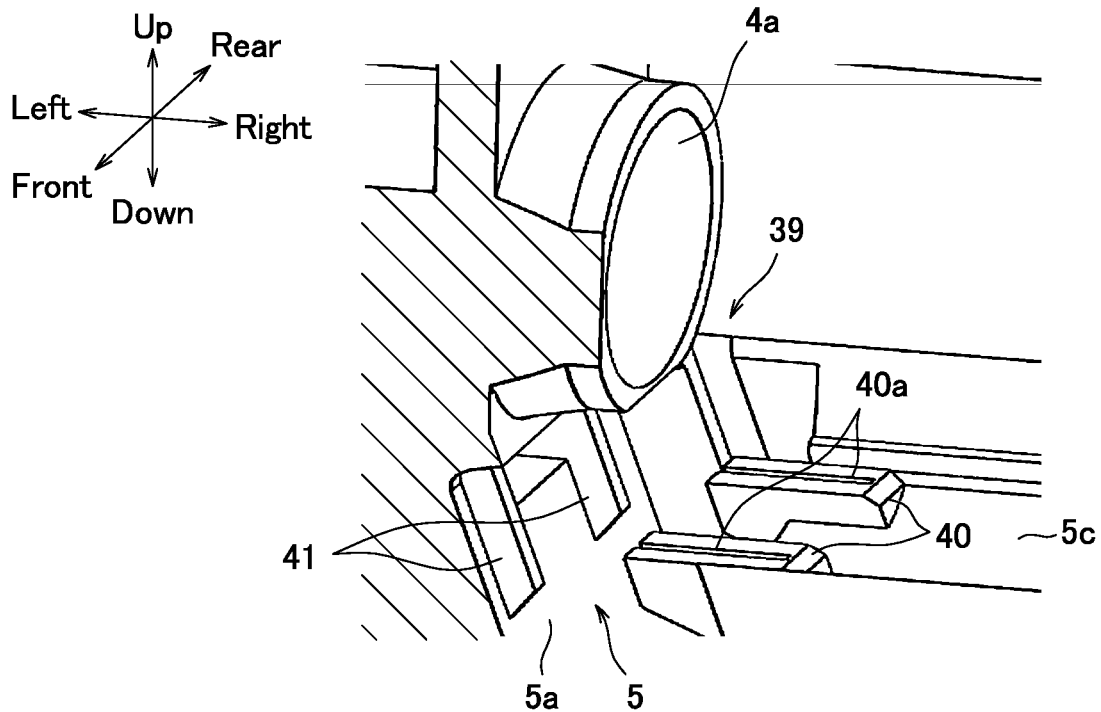
FIG. 8 is an oblique view showing the top of the board containment chamber prior to the control board being inserted.
Figure 9:
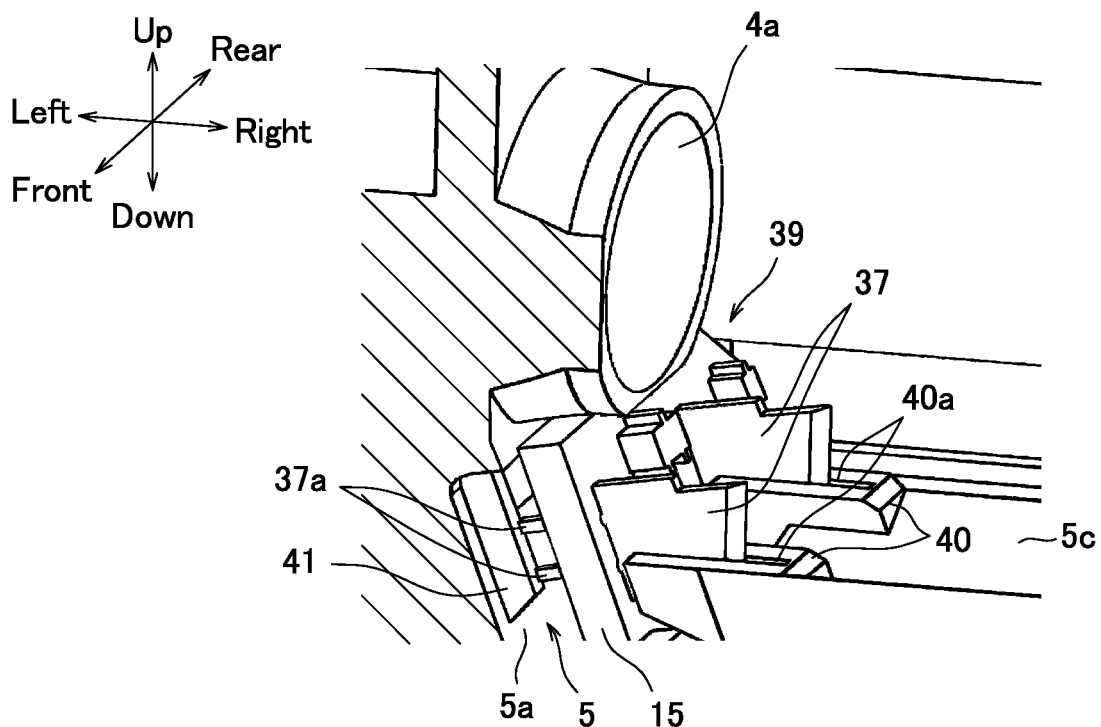
FIG. 9 is an oblique view showing the top of the board containment chamber after the control board is inserted.
Figure 10:
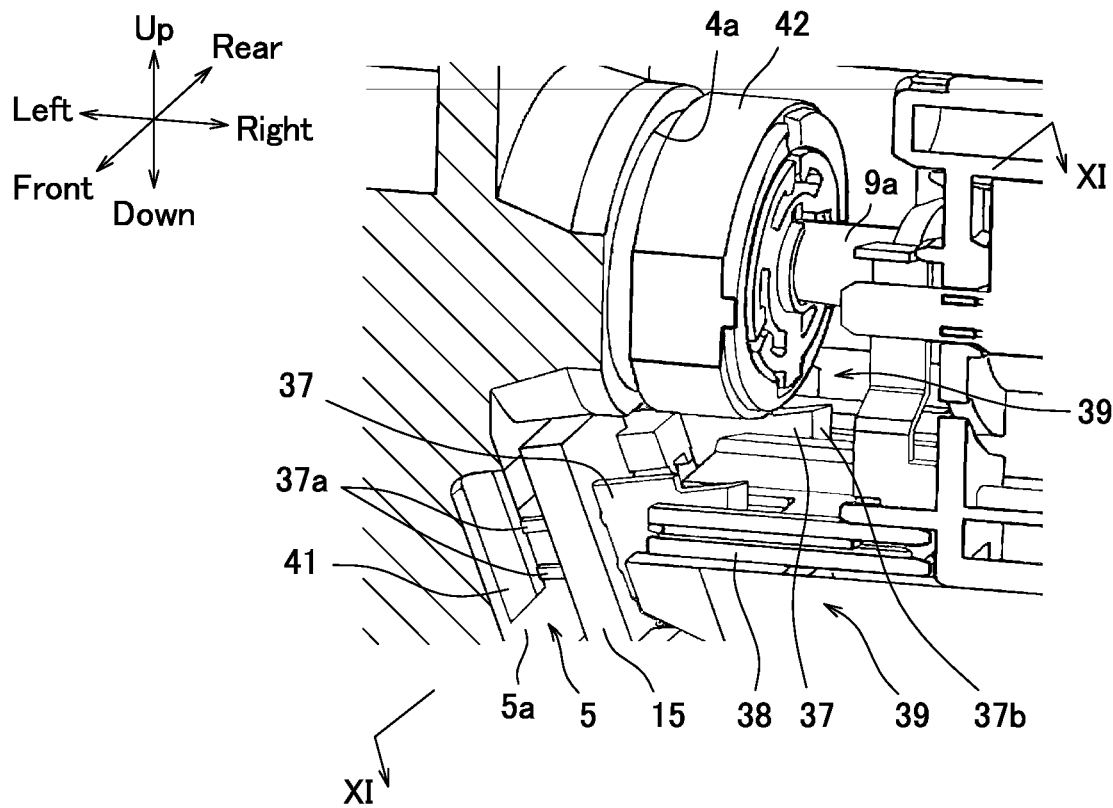
FIG. 10 is an oblique view showing the top of the board containment chamber when a motor-side terminal is fitted into a board-side terminal.
Figure 11:
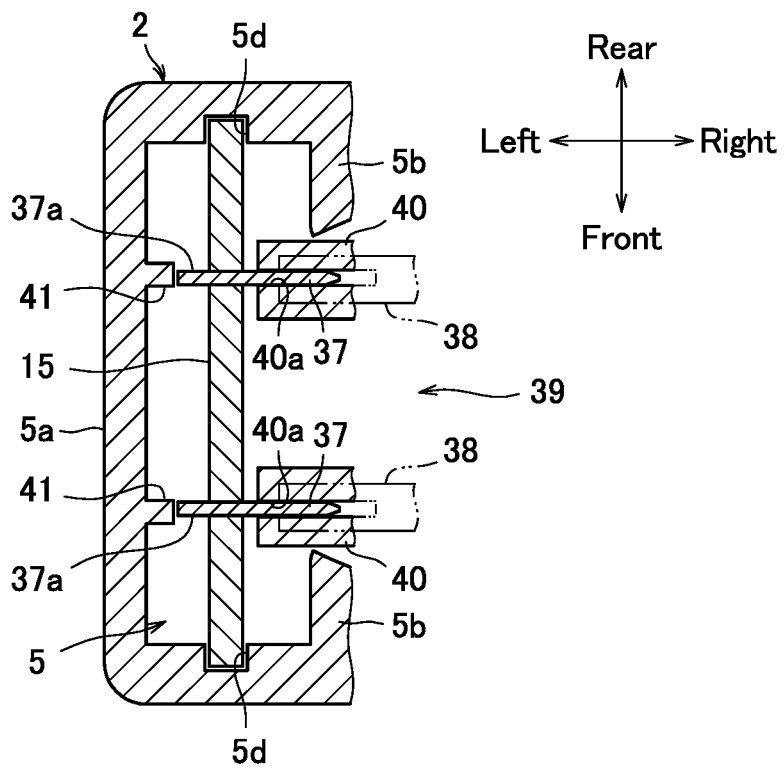
FIG. 11 is a cross-sectional view along line XI-XI in FIG. 10 when the motor-side terminal is fitted into the board-side terminal.

FIG. 8 is an oblique view showing the top of the board containment chamber 5 prior to the control board 15 being inserted. FIG. 9 is an oblique view showing the top of the board containment chamber 5 after the control board 15 is inserted. FIG. 10 is an oblique view showing the top of the board containment chamber 5 when motor-side terminals are fitted into the board-side terminals 37 from on top of the top face 37b. FIG. 11 is a cross-sectional view along line XI-XI in FIG. 10 when the motor-side terminals are fitted into the board-side terminals 37.

As shown in FIGS. 10 and 11 in particular, a front and rear pair of motor-side terminals 38 are fitted into the board-side terminals 37 of the control board 15 inside the board containment chamber 5, thereby electrically connecting the control board 15 and the motor 9. These connections are called terminal connection units 39, which are described in detail below. As can be seen, the motor-side terminals 38 are fitted into the board-side terminals 37 from on top of the top face 37b.

As shown in FIG. 8, an opening 4a to the right side in the worm containment chamber 4 is located above the board containment chamber 5, establishing a connection therebetween. With the motor 9 secured to the right-side surface of the main casing unit 2, the output shaft 9a passes above the board containment chamber 5 and is inserted into the worm containment chamber 4 through the opening 4a, as shown in FIG. 10. The rotational angle sensor 42 for detecting the angle of rotation of the motor is provided to the output shaft 9a.

As shown in FIG. 8, a supporting wall 5c extends horizontally towards the left side from the top edge of the right wall 5b of the board containment chamber 5, and a pair of front and rear groove projections 40 having terminal guide grooves 40a (the terminal guide units) are formed on the left end of the supporting wall 5c. The terminal guide grooves 40a are shaped so as to be open to the left side and vertically. The front and rear positions of the terminal guide grooves 40a match the front and rear positions of the board-side terminals 37. Therefore, as shown in FIG. 9, the board-side terminals 37 are inserted into the corresponding terminal guide grooves 40a with the control board 15 disposed inside the board containment chamber 5.

On the other hand, a pair of front and rear terminal position limiting units 41 are provided protruding and extending vertically to the top of the left wall 5*a* inside the board containment chamber 5. The front and rear positions of the terminal position limiting units 41 match the front and rear positions of the board-side terminals 37, and tips of the press-fitting ends 37*a* of the board-side terminals 37 match the right-side surface of the terminal position limiting units 41 in the left-and-right direction. Therefore, as shown in FIG. 9, tips of the press-fitting ends 37*a* of the board-side terminals 37 abut, or face across a small gap, the corresponding terminal position limiting units 41 from the right side, with the control board 15 inserted into the board containment chamber 5.

As shown in FIGS. 10 and 11, the pair of motor-side terminals 38 protrude out from the motor 9 towards the left side, the front and rear positions of the motor-side terminals 38 match the front and rear positions of the board-side terminals 37, and the vertical positions of the motor-side terminals 38 match the vertical positions of the board-side terminals 37. The tips of the motor-side terminals 38 are split front and rear, and the control board 15 and the motor 9 are electrically connected by fitting the corresponding board-side terminals 37 thereinto. The support from the connector cover 9 side via the motor-side terminals 38 limits movement of the bottom of the control board 15 inside the board containment chamber 5.

(Operational Effects of the Configuration of the Top Area of the Control Board 15)

The operational effects provided by the configuration around the top area of the control board 15 thus constituted are described next.

First, as shown in FIG. 2, the top edge of the control board 15 moves to the left side by tilting the control board 15, with respect to an upright attitude which intersects at a right angle the axial line Cm of the output shaft 9*a* of the motor 9. Therefore, the top end of the control board 15 is located in the dead space E shown in FIG. 2 formed between the wheel containment chamber 3, the worm containment chamber 4, and the board containment chamber 5, moving towards the left away from the bottom two motor securing units 13 in the axial line Cm direction of the output shaft 9*a* as a result.

Because an overlap between the control board 15 and the motor securing units 13 is avoided in this manner, there is no need to form escape sections in the control board 15 to prevent interference with the motor securing units 13. Hence, it is possible to eliminate restrictions on board shape and achieve a control board 15 with an appropriate board shape, e.g., a common elongated rectangular shape. Accordingly, the control board 15 can be made at low cost, meaning cost reductions can be achieved for the power window unit 1 as well. And because elements can be arranged optimally on the control board 15 due to achieving maximum board area, reliability can be improved by preventing trouble.

Furthermore, a terminal connection unit 39 is located in the top section of the control board 15 and is constituted by fitting the motor-side terminals 38 into the board-side terminals 37. The motor-side terminals 38 protrude from the motor 9, and therefore the motor 9 is inevitably located near the terminal connection unit 39 to the right side. The top of the tilted control board 15 and the terminal connection unit 39 are both displaced to the left side, and therefore the position of the motor 9 is also displaced to the left side. Note that the motor securing units 13 are also inevitably displaced to the left, but the presence of the control board 15 which is also displaced to the left side is not a factor preventing displacement of the motor securing units 13.

With the present embodiment, overlap is avoided between the control board and the motor securing units as in the technology in US Patent Application Publication No. 2003/0137202, so not only is there no need to displace the motor securing units to the right side (in a direction away from the main casing unit), but rather the motor securing units 13—and in turn the motor 9 itself—are displaced to the left. Therefore, the effect is obtained of being able to reduce the left-right length Lrl (shown in FIG. 2) of the power window unit 1.

On the other hand, when assembling the power window unit 1, the board-side terminals 37 of the terminal connection unit 39 and the motor-side terminals 38 are connected in the following procedure.

When the control board 15 is inserted into the board containment chamber 5 through the opening 18, the board-side terminals 37 gradually rise and are inserted from below into the corresponding terminal guide grooves 40*a* just before insertion is completed. The board-side terminals 37, which are small and have low rigidity, have a tendency to become misaligned in the depth direction due to tilting, etc., but are corrected to the correct front and rear positions by being inserted into the terminal guide grooves 40*a*. Once insertion of the control board 15 is complete, they are kept in the correct front and rear positions inside the terminal guide grooves 40*a* as shown in FIG. 9.

Furthermore, the press-fitting ends 37*a* of the board-side terminals 37 also gradually rise as the control board 15 is inserted, and once insertion as shown in FIG. 9 is complete, the tips of the press-fitting ends 37*a* abut, or face across a gap, the terminal position limiting units 41 from the right side.

Next, when the output shaft 9*a* of the motor 9 is inserted into the worm containment chamber 4 of the main casing unit 2 from the right side, the motor-side terminals 38 approach the board-side terminals 37 from the right side inside the board containment chamber 5. Once the flange section 9*b* of the motor 9 abuts the right-side surface of the main casing unit 2, the motor-side terminals 38 sandwich the corresponding board-side terminals 37 from the right side and are thus fitted. Because the board-side terminals 37 are kept in the correct front and rear positions in the terminal guide grooves 40*a* in this manner, the motor-side terminals 38 are fitted into the board-side terminals 37 without fail.

During assembly, the board-side terminals 37 receive a pressing force towards the left side from the motor-side terminals 38. Therefore, even if the board-side terminals 37 are in the correct front and rear positions, there is the possibility of improper fitting due to movement or deformation to the left side because of the pressing force.

However, in the present embodiment, because the terminal position limiting units 41 are limited in position by abutting the tips of the press-fitting ends 37*a* of the board-side terminals 37 from the left side, movement or deformation to the left side by the board-side terminals 37 is prevented, further solidifying the fitting with the motor-side terminals 38.

Furthermore, the pressing force from the motor-side terminals 38 is transmitted to the terminal position limiting units 41 via the board-side terminals 37 but does not act on the control board 15, so there is no risk of the control board 15 breaking. As a result, problems such as faulty contact, etc., are avoided since a solid electrical connection between the control board 15 and the motor 9 is established, which can further improve reliability.

(Operational Effects Relating to the Attitude of the Control Board 15)

The operational effects obtained by the attitude of the tilted control board 15 are described next.

Various measures have been taken conventionally to make the power window unit 1 smaller. In the present embodiment, the vertical length is reduced by making the diameter of the worm wheel 8 smaller (resulting in a smaller diameter for the wheel containment chamber 3 as well). However, because it is difficult to reduce the vertical length of the control board 15 due to the arrangement of the elements, the bottom of the control board 15 would stick out beyond the attachment bracket 6 if the control board 15 were disposed upright. As a result, the projection area seen from the right side would not be reduced even if the diameter of the wheel containment chamber 3 were reduced, and a smaller size could not be attained.

With the present embodiment, the control board 15 is tilted with reference to an upright attitude, with the top end moving to the left and the bottom end moving to the right. Therefore, the bottom can be positioned further up than the attachment bracket 6 to prevent protrusion downward while maintaining the same vertical length of the control board 15, providing the effect of allowing a reduction in the vertical length Lud (shown in FIG. 2) of the power window unit 1. Depending on the conditions, the control board 15 can be lengthened vertically to create more room for disposing elements, while preventing protrusion of the control board 15 downward.

In the power window unit 1 of the present embodiment, the left-right length Lrl and the vertical length Lud are reduced, and not only that but, on top of achieving a small size, the overall shape is maintained substantially rectangular, which is advantageous for packing.

In other words, as a result of displacing the bottom end of the control board 15 to the right side, the board containment chamber 5 and the connector cover 20 stick out further to the right side than if the control board 15 has an upright attitude. However, the right side corresponds to directly below the motor 9, so the shape of the power window unit 1 when seen from the front is kept substantially rectangular (vertical Lrl×horizontal Lud). The substantially rectangular power window unit 1 is easy to pack during mass transportation, and the lading weight per pallet can be increased. Hence, advantages are obtained not only in terms of functionality as a product, but also in the totally different area of convenience during shipping.

Incidentally, in the present embodiment, the pair of terminal position limiting units 41 were provided to the left wall 5a in the board containment chamber 5 to prevent movement or deformation of the board-side terminals 37 due to fitting with the motor-side terminals 38, but other configurations can also obtain the same operational effect. Other embodiments are described below.

Figure 12:
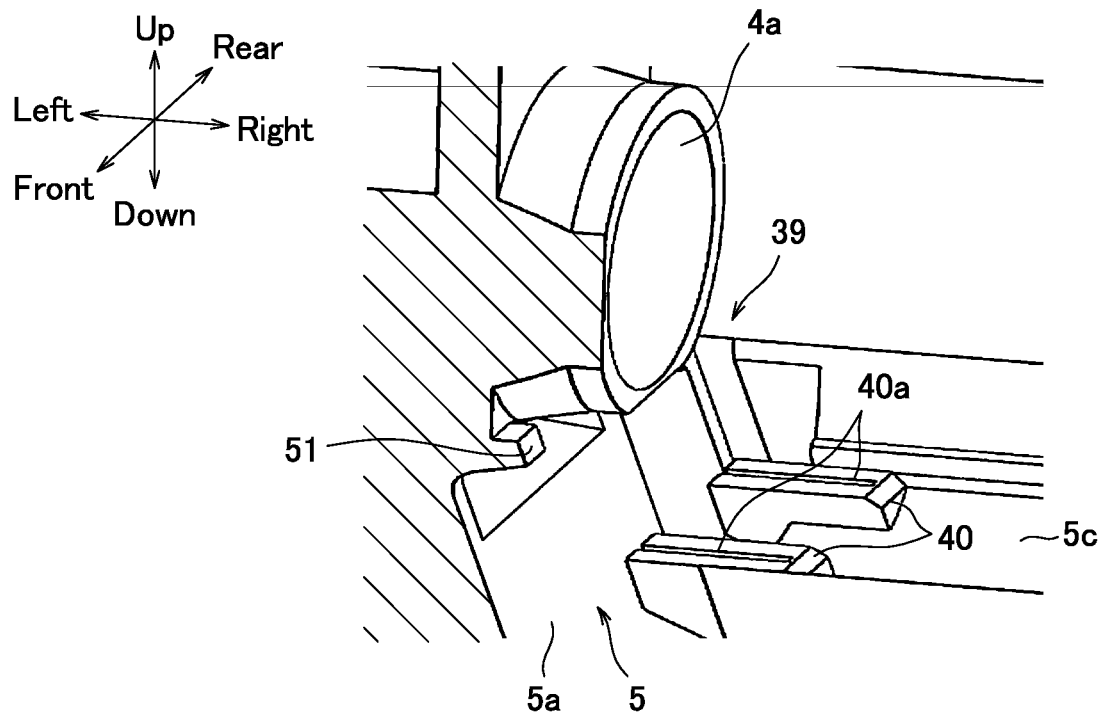
FIG. 12 is an oblique view showing the top of the board containment chamber prior to the control board being inserted in another embodiment.
Figure 13:
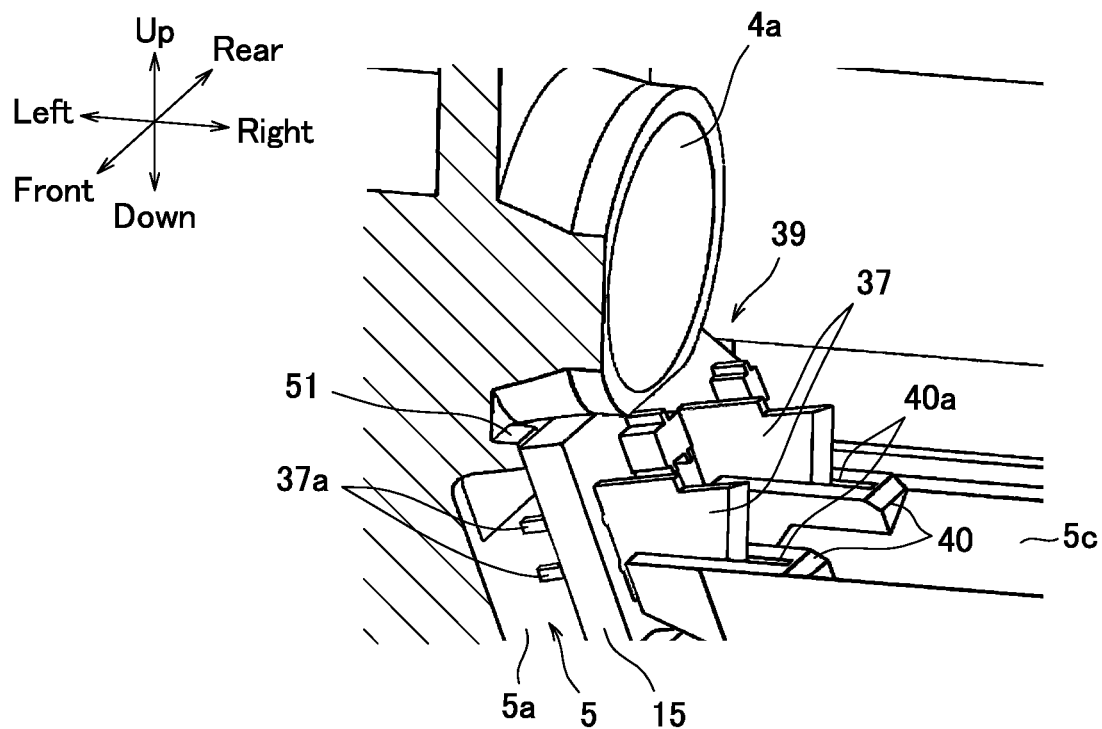
FIG. 13 is an oblique view showing the top of the board containment chamber after the control board is inserted in another embodiment.
Figure 14:
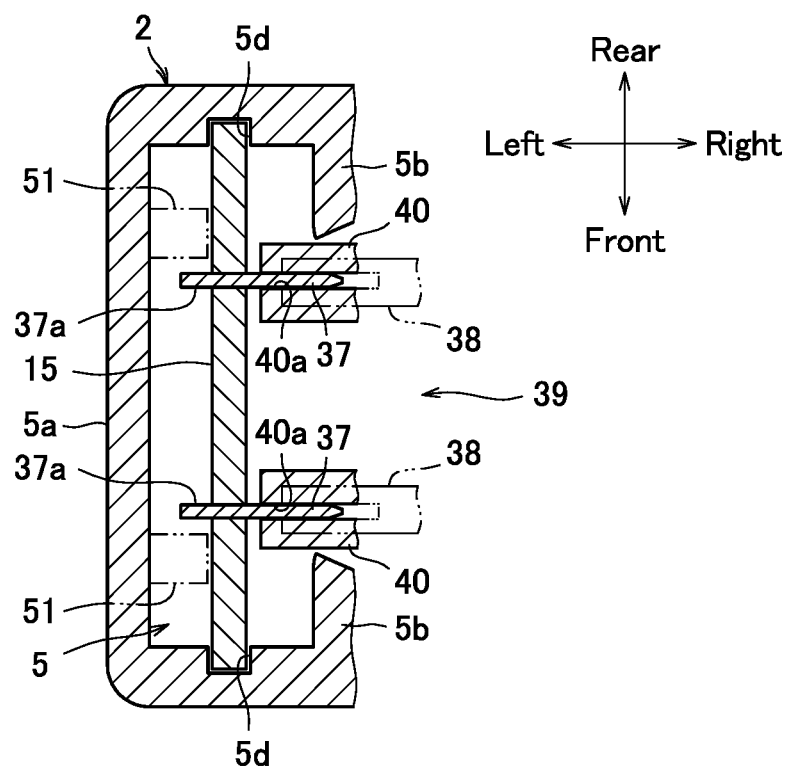
FIG. 14 is a cross-sectional view corresponding to FIG. 11 when the motor-side terminal is fitted into the board-side terminal in another embodiment.

FIG. 12 is an oblique view showing the top of the board containment chamber 5 prior to the control board 15 being inserted in another embodiment. FIG. 13 is an oblique view showing the top of the board containment chamber 5 after the control board 15 is inserted in another embodiment. FIG. 14 is a cross-sectional view corresponding to FIG. 11 when the motor-side terminals 38 are fitted into the board-side terminals 37 in another embodiment.

As shown in these drawings, a pair of front and rear board position limiting units 51 (only one is shown in FIGS. 13 and 14) are provided to the top of the left wall 5a in the board containment chamber 5 instead of the terminal position limiting units 41. When the control board 15 is inserted into the board containment chamber 5, the top of the control board 15 abuts, or faces across a small gap, the right-side surface of the board position limiting units 51 from the right side, as shown in FIGS. 13 and 14.

When the motor-side terminals 38 are fitted into the board-side terminals 37 of the control board 15 from the right side, the board-side terminals 37 receive a pressing force towards the left side. When this happens, the board position limiting units 51 abut the top of the control board 15 from the left side, thereby limiting the position and preventing warping or deformation of the control board 15 due to the pressing force. As a result, the board-side terminals 37 are also limited in position via the control board 15, movement or deformation to the left side thereby being prevented. Hence, like in the previous embodiment, the board-side terminals 37 and the motor-side terminals 38 are fitted even more solidly, making it possible to prevent problems such as faulty contact, etc., ahead of time.

Figure 15:
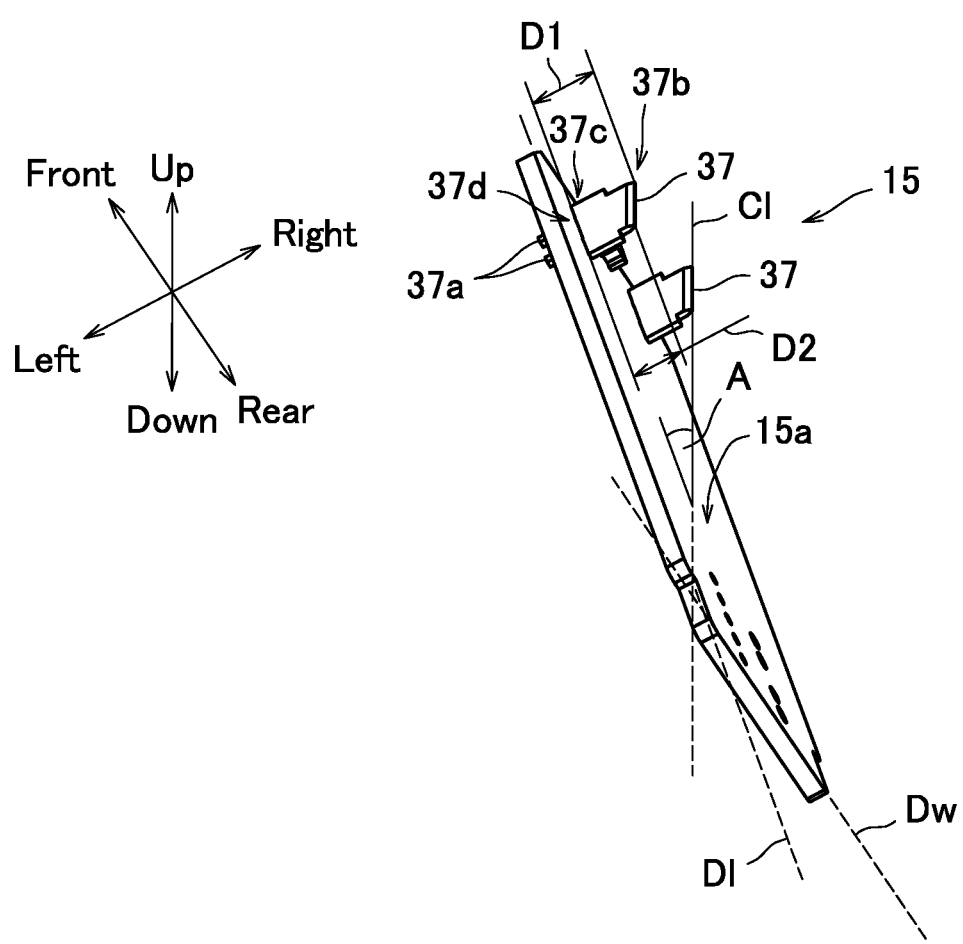
FIG. 15 is an oblique view showing the control board and the board-side terminals in more detail.

In FIG. 15, an oblique view is provided showing the control board 15 and the board-side terminals 37 in more detail. As can be seen, the control board 15 has the shape of an elongated rectangle. The control board 15 includes a control board face 15a configured for mounting the board-side terminals 37. The control board face 15a extends along a longitudinal direction Dl and along a width direction Dw perpendicular to the longitudinal direction Dl. The longitudinal direction Dl and the width direction Dw together span the control board face 15a. The longitudinal direction Dl is substantially parallel to the insertion direction of the control board 15 (indicated by the arrow "Insert" in FIG. 4).

The control board 15 is provided with board-side terminals 37 on a motor-side end (motor-side site) thereof. As already mentioned in connection with FIG. 7, each board-side terminal 37 includes a top face 37b and a bottom face 37c opposite to the top face 37b. The top face 37b is configured to be fitted into the motor-side terminal 38, as shown, for example, in FIG. 10. The bottom face 37c is configured to secure the board-side terminal 37 to the control board 15. For this, upper and lower press-fitting ends 37a are provided integrally on the bottom face 37c of each board-side terminal 37 in a protruding manner so as to be press-fitted into corresponding holes formed in the control board 15. In addition or alternatively to the press-fitting ends 37a, the bottom face 37c is at least partially soldered onto the control board 15. This is shown schematically by regions 37d where bottom face 37c is soldered onto control board 15. Of course, instead of soldering, bottom face 37c may also be glued, welded or attached to control board 15 by any other adhesive means known in the art.

As can be further seen in FIG. 15, a first distance (short: distance) D1 (measured perpendicular to the control board 15 or control board face 15a) between a motor-side end of the top face 37 and the control board 15 is larger than a second distance (short: distance) D2 (measured perpendicular to the control board 15 or control board face 15a) between a connector-side end of the top face 37 and the control board 15, the connector-side end of the top face 37b being opposite to the motor-side end of the top face 37b. When the first distance D1 is larger than the second distance D2, this arrangement results in the top face 37b being non-parallel to the control board 15 or control board face 15a. More precisely, a connection line Cl connecting the motor-side end of the top face 37b and the connector-side end of the top face 37b (also termed: a first direction of the top face from the motor-side end to the connector-side end) forms an acute angle A with the control board 15 or the control board face 15a.

In an advantageous embodiment, the angle A is selected such that a first direction of the top face 37b from the motor-side end to the connector-side end (i.e. the connection line Cl) is substantially perpendicular to the axial output shaft line Cm of the output shaft 9a of the motor 9. In this arrangement, because the motor-side terminal 38 is fitted into the board-side terminal 37 along a fitting direction substantially parallel to the axial output shaft line Cm (see FIG. 2), it is ensured that the motor-side terminal 38 is always securely and long-term reliably fitted into the board-side terminal 37 from on top of the top face 37b.

As can be further seen in FIG. 15, the overall shape of the top face 37b is in a second direction perpendicular to the first direction (i.e. in a direction substantially parallel to the width direction Dw of the control board 15) at least partially convex. With this arrangement, the motor-side terminal 38 can be easily fitted with a reduced fitting force into the board-side terminal 37 from on top of the top face 37b. The term "convex" as used herein indicates that the overall shape of the top face 37b is curved outwards, i.e. away from the bottom face 37c.

As can be further seen in FIG. 15 and as already mentioned, a pair of upper and lower press-fitting ends 37a protrudes from the bottom face 37c of each board-side terminal 37 in order to secure the board-side terminal 37 to the control board 15. Preferably, the upper press-fitting end 37a is arranged such that it is located as close as possible to a motor-side end of the bottom face 37c and the lower press-fitting end 37a is arranged such that it is located as close as possible to a connector-side end of the bottom face 37c. The term "as close as possible" as used herein indicates that the pair of upper and lower press-fitting ends 37a are located as close as possible to the motor-side end and the connector-side end from a manufacturing point of view taking into account manufacturing tolerances. When the upper and lower press-fitting ends 37a are located as close as possible to the motor-side end and the connector-side end, respectively, a distance (measured along the longitudinal direction Dl) between two adjacent press-fitting ends 37a becomes maximized. As a result, forces acting upon the board-side terminal 37 during fitting of the motor-side terminal 38 into the board-side terminal 37 can be absorbed even better which allows for a more stable and long-term reliable electrical connection between the motor-side terminals 38 and the board-side terminals 37.

In another embodiment not shown, the board-side terminal 37 may include more than two press-fitting ends 37a.

Figure 16:
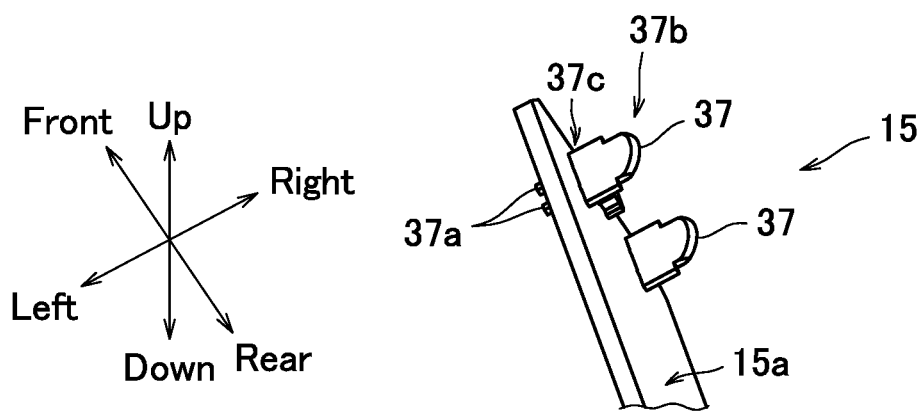
FIG. 16 is a detailed oblique view of the control board and another embodiment of the board-side terminals.

Referring now to FIG. 16, a detailed oblique view of the control board 15 is shown together with another embodiment of the board-side terminal 37. For clarity, regions 37d are not shown. In the embodiment shown in FIG. 16, in addition to the above mentioned non-parallel arrangement of the top face 37b with respect to the control board 15, the overall shape of the top face 37b in a first direction from the motor-side end to the connector-side end, i.e. along connection line Cl, is additionally at least partially convex. Again, the term "convex" as used herein indicates that the overall shape of the top face 37b in the first direction is curved outwards, i.e. away from the bottom face 37c. In this configuration, upon fitting the motor-side terminal 38 into the board-side terminal 37, fitting forces can be reduced because the motor-side terminal 38 is facing a convex top face 37b and thus an overall contact area between the motor-side terminal 38 and the board-side terminal 37 is reduced.

Figure 17:
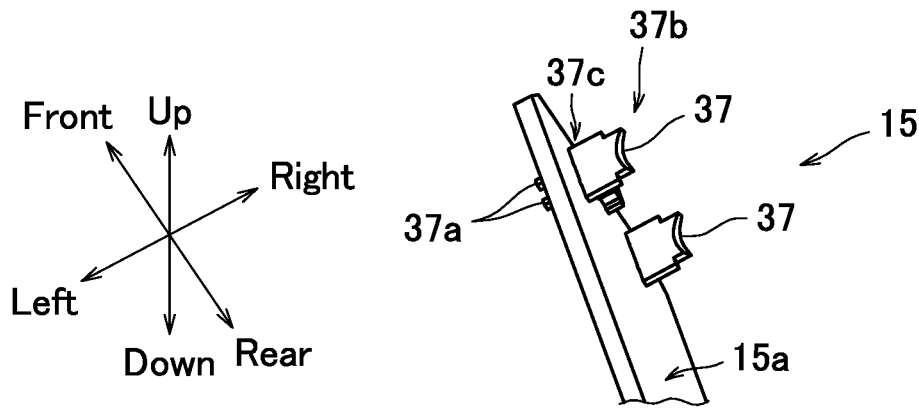
FIG. 17 is a detailed oblique view of the control board and yet another embodiment of the board-side terminals.

Referring now to FIG. 17, a detailed oblique view of the control board 15 is shown together with yet another embodiment of the board-side terminal 37. For clarity, regions 37d are not shown. In the embodiment shown in FIG. 17, in addition to the above mentioned non-parallel arrangement of the top face 37b with respect to the control board 15, the overall shape of the top face 37b in a first direction from the motor-side end to the connector-side end, i.e. along connection line Cl, is additionally at least partially concave. The term "concave" as used herein indicates that the overall shape of the top face 37b in the first direction is curved inwards, i.e. towards the bottom face 37c. In this configuration, upon fitting the motor-side terminal 38 into the board-side terminal 37, similarly to the convex shape (see FIG. 16), fitting forces between the motor-side terminal 38 and the board-side terminal 37 can be reduced because the motor-side terminal 38 is facing a concave top face 37b and thus an overall contact area between the motor-side terminal 38 and the board-side terminal 37 is reduced.

In other embodiments not shown, the overall shape of the top face 37b in the first direction from the motor-side end to the connector-side end may be a combination of an at least partially convex and an at least partially convex shape.

The description of the embodiments is finished, but the embodiments of the present disclosure are not limited to these embodiments. For example, a concrete example of the power window unit 1 which raises and lowers a window was given in the aforementioned embodiments, but the type of motor unit is not limited to this, and may be changed as appropriate. For example, the present disclosure may be applied to a motor which opens and closes a sunroof.

REFERENCE SIGNS LIST

1 Power window unit
2 Main casing unit
3 Wheel containment chamber
5 Board containment chamber
7 Front cover (cover member)
8 Worm wheel
9 Motor
9a Output shaft
10 Worm
12 Screw (securing member)
13 Motor securing unit
15 Control board
15a Control board face
18 Opening
19 Connector terminal
20 Connector cover
21 Connector
22 Watertight packing
27 Lower engaging claw (engagement unit)
37 Board-side terminal
37a Press-fitting ends
37b Top face of the board-side terminal
37c Bottom face of the board-side terminal
37d Regions
38 Motor-side terminal
40a Terminal guide groove (terminal guide unit)
41 Terminal position limiting unit
51 Board position limiting unit
Cl connection line
Cw Axial line of the worm wheel
Cm Axial line of the output shaft (axial output shaft line)
Dl Longitudinal direction of control board
Dw Width direction of control board
D1 First distance
D2 Second distance
A Angle

The invention claimed is:

1. A decelerator-equipped motor unit, comprising:
   a worm wheel which is disposed inside a wheel containment chamber of a main casing unit and which is rotatably supported around an axial line,
   a motor which is secured by securing members to the main casing unit from a first side which intersects the axial line of the worm wheel at a right angle, and in which a worm which is affixed to an output shaft meshes with the worm wheel,
   a board containment chamber demarcated in the main casing unit so as to neighbor the wheel containment chamber on one side, and
   a control board which is disposed in the board containment chamber in an attitude intersecting with an axial output shaft line of the output shaft of the motor, the control board being electrically connected with the motor and being provided with a connector which is connected with the outside on one side of the control board,
   wherein the control board is electrically connected to the motor by a board-side terminal being provided to a motor-side site on the control board, and a motor-side terminal of the motor which is secured to the main casing unit towards said first side and fitted into the board-side terminal from on top of a top face of the board-side terminal,
   wherein a distance between a motor-side end of the top face and the circuit board is longer than a distance between a connector-side end of the top face and the circuit board,
   wherein the board-side terminal includes a bottom face opposite to the top face, and
   wherein the board-side terminal further includes press-fitting ends protruding from the bottom face and being press-fitted into holes formed in the control board, and/or the bottom face is at least partially soldered onto the control board.

2. The decelerator-equipped motor unit of claim 1, wherein the board-side terminal includes the press-fitting ends protruding from the bottom face and being press-fitted into the holes formed in the control board, and wherein at least one of the press-fitting ends is located as close as possible to a motor-side end of the bottom face, and at least one of the press-fitting ends is located as close as possible to a connector-side end of the bottom face.

3. The decelerator-equipped motor unit of claim 1, wherein an overall shape of the top face in a first direction from the motor-side end of the top face to the connector-side end of the top face is at least partially convex.

4. The decelerator-equipped motor unit of claim 1, wherein an overall shape of the top face in a first direction from the motor-side end of the top face to the connector-side end of the top face is at least partially concave.

5. The decelerator-equipped motor unit of claim 3, wherein an overall shape of the top face in a second direction perpendicular to the first direction is at least partially convex.

6. The decelerator-equipped motor unit of claim 1, wherein
   the control board is tilted in a direction such that a motor-side end of the control board is displaced towards another side from an attitude intersecting the axial output shaft line of the output shaft of the motor at a right angle, and
   the distance between the motor-side end of the top face and the circuit board and the distance between the connector-side end of the top face and the circuit board is selected such that a first direction of the top face from the motor-side end to the connector-side end is substantially perpendicular to the axial output shaft line.

7. The decelerator-equipped motor unit of claim 4, wherein an overall shape of the top face in a second direction perpendicular to the first direction is at least partially convex.

* * * * *